United States Patent [19]
Okano

[11] Patent Number: 5,155,376
[45] Date of Patent: Oct. 13, 1992

[54] VEHICLE SAFETY DEVICE ACTUATING CIRCUIT WITH MONITORING CURRENT REGULATOR

[75] Inventor: Masami Okano, Higashimatsuyama, Japan

[73] Assignee: Diesel Kiki Co., Ltd., Tokyo, Japan

[21] Appl. No.: 537,596

[22] Filed: Jun. 14, 1990

[30] Foreign Application Priority Data

Jun. 15, 1989 [JP] Japan .................................. 1-150507

[51] Int. Cl.$^5$ ............................................. B60R 21/32
[52] U.S. Cl. .................................. 307/10.1; 340/438; 280/735
[58] Field of Search ............... 307/10.1, 121; 340/436, 340/438; 280/735; 180/274, 282

[56] References Cited

U.S. PATENT DOCUMENTS

| | | | |
|---|---|---|---|
| 3,916,376 | 10/1975 | Tuttle | 340/438 |
| 4,020,453 | 4/1977 | Spies et al. | 280/735 |
| 4,243,971 | 1/1981 | Suchowerskyj et al. | 340/438 |
| 4,835,513 | 5/1989 | McCurdy et al. | 340/438 |
| 4,851,705 | 7/1989 | Musser et al. | 307/10.1 |

FOREIGN PATENT DOCUMENTS

| | | |
|---|---|---|
| 54-47244 | 4/1979 | Japan . |
| 55-25633 | 2/1980 | Japan . |
| 55-63494 | 5/1980 | Japan . |
| 60-7372 | 1/1985 | Japan . |
| 61-241231 | 10/1986 | Japan . |
| 63-241467 | 10/1988 | Japan . |

Primary Examiner—A. D. Pellinen
Assistant Examiner—David Osborn
Attorney, Agent, or Firm—Pollock, Vande Sande & Priddy

[57] ABSTRACT

In a vehicle safety device control apparatus having an energy reservoir, a current regulator for regulating the current supplied from the energy reservoir to a firing element of the safety device, and a controller for controlling the current regulator so as to supply energy for actuating the firing element in response to a vehicle collision, the current regulator is also controlled so as to supply a check current with a level insufficient to actuate the firing element to the fired element so as to produce a detection signal indicative of the condition of the firing element. The condition of the detection signal is checked by a first discriminator and the conditions of the channel and the firing element are determined. In the case where the capacity of the energy reservoir is not sufficient, the output voltage of the energy reservoir falls sharply when the check current is drawn therefrom. A second discriminator is provided to discriminate whether or not the capacity of the energy reservoir is sufficient.

7 Claims, 2 Drawing Sheets

VEHICLE SAFETY DEVICE ACTUATING CIRCUIT WITH MONITORING CURRENT REGULATOR

BACKGROUND OF THE INVENTION

The present invention relates to an apparatus for controlling vehicle safety devices such as air-bags, safety belt tightening devices and the like in a motor vehicle.

DESCRIPTION OF THE PRIOR ART

For ensuring the safety of motor vehicle passengers, there have been developed various vehicle safety devices such as the air-bag, the safety belt tightening device and the like. It is necessary for these devices to always monitor whether or not the control apparatus is in the available condition where the safety device is made to operate assuredly upon the occurrence of a vehicle collision, and to inform the driver that trouble has occurred when it occurs. To satisfy these requirements, the conventional apparatus has a plurality of circuits for monitoring or checking the capacity of an energy reservoir for supplying the firing current to an actuating element of the safety device, a switching transistor for controlling the supply of the firing current and the like.

Consequently, the conventional control circuit for safety devices needs many parts for a monitoring circuit and has complex circuitry. Furthermore, the conventional control circuit has a disadvantage in that the check of the switching transistor is possible only at the time the power is turned ON.

SUMMARY OF THE INVENTION

It is therefore an object of the present invention to provide an improved vehicle safety device controlling apparatus.

It is another object of the present invention to provide a vehicle safety device which is able to check the operability of an actuating current control portion and the capacity of the energy reservoir with a simple circuit arrangement.

According to the present invention, in a control apparatus for a vehicle safety device, such as an air-bag, a safety belt tightening device or the like, which has an energy reservoir for providing electric energy for actuating a firing element of the vehicle safety device, a current regulating means provided between the energy reservoir and the firing element, and a first control means for controlling the current regulating means so as to provide to the firing element the energy necessary for actuating the firing element in response to a vehicle collision, the apparatus comprises a second control means for controlling the current regulating means so as to provide a check current to the firing element, the check current having a level insufficient to actuate the firing element, a detector for producing a detection signal indicative of the condition of the firing element in response to the voltage signal developed across the firing element by the application of the check current, a first discriminating means responsive to the detection signal for discriminating whether or not there is a malfunction in the firing element or a channel for supplying a firing current to the firing element, and a second discriminating means for discriminating whether or not there is a malfunction in the energy reservoir in response to the change in the output voltage of the energy reservoir when the check current flows.

To check the operability of the control apparatus, the check current is passed through the current regulating means from the energy reservoir to the firing element, for example, during a predetermined time period. The detection signal is obtained by the detector without firing of the firing element when the check current flows through the firing element because the level of the check current is less than enough to actuate the firing element. The condition of the detection signal is checked by the first discriminating means and the conditions of the channel and the firing element are determined. In the case where the capacity of the energy reservoir is not sufficient, the output voltage of the energy reservoir falls sharply when the check current is derived therefrom. The second discriminating means is adapted to discriminate whether or not the capacity of the energy reservoir is sufficient, on the basis of the change in the output voltage.

The invention will be better understood and other objects and advantages thereof will be more apparent from the following detailed description of preferred embodiments with reference to the accompanying drawings.

DESCRIPTION OF THE PREFERRED EMBODIMENTS

Figure 1:
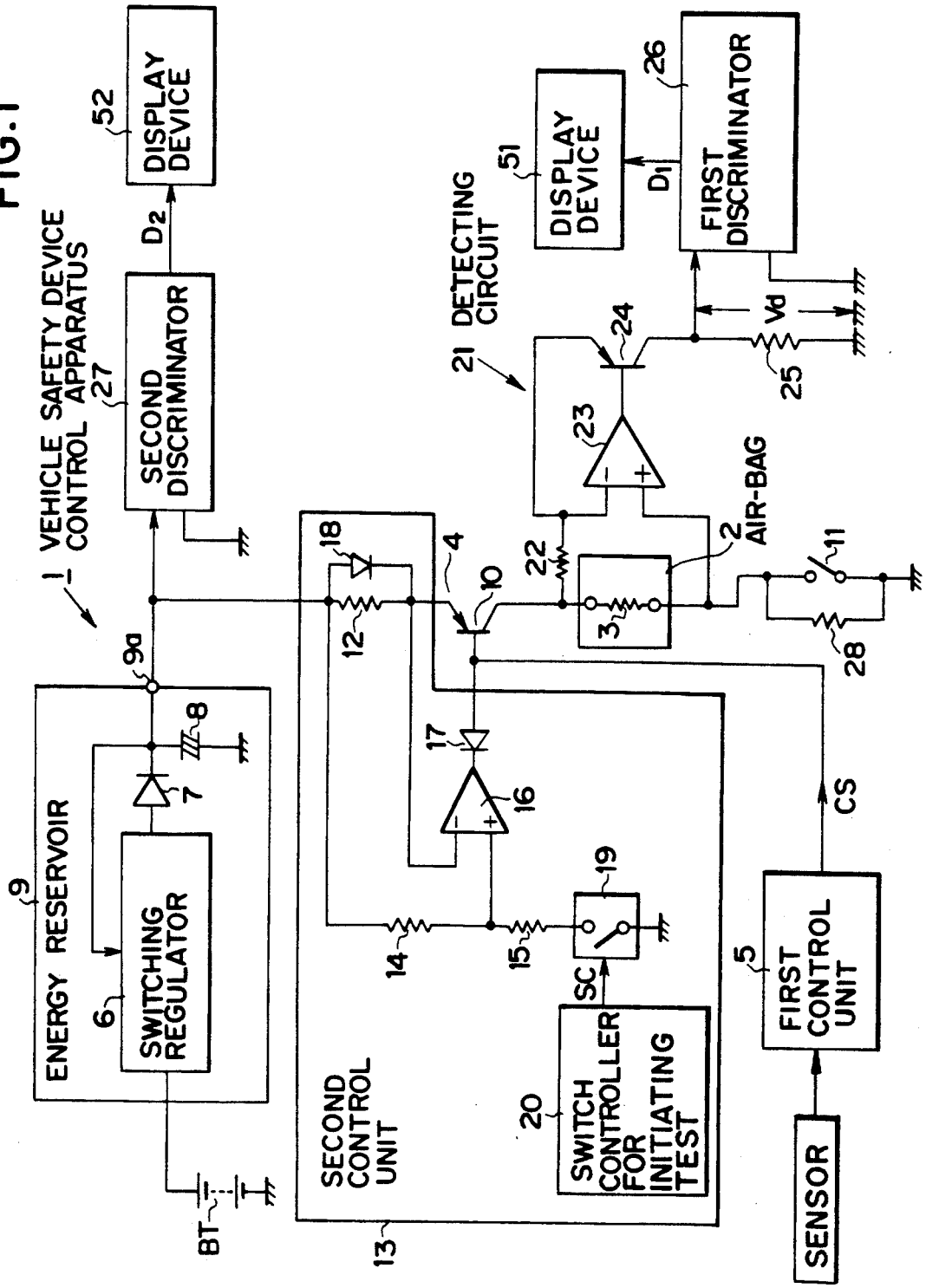
FIG. 1 is a circuit diagram showing an embodiment of a vehicle safety device control apparatus according to the present invention.

FIG. 1 shows a vehicle safety device control apparatus 1 for controlling the actuating current for an electrically fired actuator 3 provided in an air-bag 2 mounted on a vehicle (not shown). The vehicle safety device control apparatus 1 comprises a circuit 4 for providing a current to the electrically fired actuator 3 and a first control unit 5 for producing a control signal CS for controlling the circuit 4 so as to supply the actuating current to the electrically fired actuator 3 when a vehicle collision has occurred. For the above described control of the actuating current, the first control unit 5 has a conventional vehicle collision detection system for detecting vehicle collision.

The circuit 4 has a current regulating transistor 10 which is connected in series with the electrically fired actuator 3 grounded through a safety switch 11, and the emitter of the current regulating transistor 10 is connected through a detecting resistor 12 to an output terminal 9a of an energy reservoir 9. The energy reservoir 9 has a conventional arrangement in which there is provided a switching regulator 6 for stepping-up the voltage of a battery BT and the stepped-up output voltage derived from the switching regulator 6 is applied through a diode 7 to a capacitor 8 of large capacity. The control signal CS is applied to the base of the current regulating transistor 10 and the current regulating transistor 10 assumes a fully conductive state when a vehicle collision has occurred. In this case, since the safety switch 11 is closed if the running speed of the vehicle is higher than a prescribed level, it follows that actuating current with a level sufficient to actuate the electrically fired actuator 3 flows through the circuit 4 from the energy reservoir 9 and the electrically fired actuator 3 is fired to cause the inflation of the air-bag 2.

The detecting resistor 12 is for detecting the level of the current flowing through the circuit 4, and its resistance value is determined to be low enough to ensure that the electrically fired actuator 3 is not prevented from being fired at the occurrence of a vehicle collision.

To monitor whether or not the condition of the circuit 4 is such that the actuation of the electrically fired actuator 3 can be assuredly effected in response to the control signal CS produced at the occurrence of a vehicle collision, in other wards, to monitor whether or not the circuit 4 is in its normal operating condition, the vehicle safety device control system 1 has a second control unit 13 for controlling the conductive state of the current regulating transistor 10 to cause a check current to flow into the circuit 4 at a predetermined time. The second control unit 13 includes the detecting resistor 12 with which a diode 18 is connected in parallel, and the voltage appearing at the connecting point of the transistor 10 and the detecting resistor 12 is applied to the inverted input terminal of an operational amplifier 16. To obtain a reference voltage to be supplied to the non-inverting input terminal of the operational amplifier 16, resistors 14 and 15 and a switch 19 are connected in series between the output terminal 9a of the energy reservoir 9 and ground. The output voltage of the energy reservoir 9 is divided by the resistors 14 and 15, and the resulting divided voltage is applied to the non-inverting input terminal of the operational amplifier 16. The switch 19 is controlled so as to be opened or closed by a switch controller 20. In this embodiment the switch controller 20 is a pulse generator for providing a pulse signal as a switch control signal SC, and the switch 19 is closed only when the level of the pulse signal is high. Accordingly, the switch 19 is repeatedly closed during a predetermined period time at a prescribed time intervals. The output voltage of the operational amplifier 16 is applied through a diode 17 to the base of the current regulating transistor 10.

With the circuit arrangement of the second control unit 13, the operational amplifier 16 is responsive to the voltage developed across the detecting resistor 12 and the conductivity of the current regulating transistor 10 is controlled in such a way that the voltage level at the non-inverting input terminal of the operational amplifier 16 is equal to that at the inverted input terminal thereof. Thus, a current with a predetermined constant level passes through the circuit 4 as a check current while the switch 19 is closed. In the circuit of the second control unit 13, since the level of the reference voltage obtained by the use of the resistors 14 and 15 is designed so as to be less than the diffusion voltage of the diode 18, the diode 18 is prevented from becoming a conductive even when the check current flows through the circuit 4.

The vehicle safety device control apparatus 1 further comprises a detecting circuit 21 for detecting the level of the voltage developed across the electrically fired actuator 3 by the supply of the check current to the circuit 4. The detecting circuit 21 has an operational amplifier 23 to which the voltage developed across the electrically fired actuator 3 is applied through an input resistor 22, and the output signal of the operational amplifier 23 is applied to the base of a transistor 24 having its emitter connected with the inverted input terminal of the operational amplifier 23. The collector of the transistor 24 is grounded through a resistor 25 and a detection voltage Vd corresponding to the voltage developed across the electrically fired actuator 3 is developed across the resistor 25.

The detection voltage Vd is input to a first discriminator 26 to discriminate whether or not the level of the detection voltage Vd is within a predetermined range, and determination is made as to whether or not the circuit 4 is in a state to be operable when the control signal CS is applied to the current regulating transistor 10. The first discriminator 26 is realized by the use of a conventional voltage comparator or comparators, and the resulting signal $D_1$ indicative of the determination in the first discriminator 26 is provided to a display device 51 to indicate when there is a malfunction in the circuit 4 and or the electrically fired actuator 3.

The output voltage appearing on the output terminal 9a of the energy reservoir 9 is applied to a second discriminator 27, wherein the change in the level of the output voltage of the energy reservoir 9 caused by the drawing of the check current therefrom is monitored, and this makes it possible to check the condition of the energy reservoir 9, particularly the capacity of the capacitor 8. The second discriminator 27 may be arranged similarly to a conventional one by the use of, for example, a voltage comparator for comparing the level of the output voltage of the energy reservoir 9 with a predetermined reference voltage signal. The resulting signal $D_2$ indicative of the determination in the second discriminator 27 is produced from the second discriminator 27 and the signal $D_2$ is applied to another display device 52 to indicate when there is a malfunction in the energy reservoir 9.

With the constitution described above, the switch 19 is controlled by the switch controller 20 to be closed during the predetermined time period at appropriate time intervals, whereby the transistor 10 assumes the conductive state necessary for providing the check current with the predetermined level into the circuit 4. The level of the voltage developed across the electrically fired actuator 3 by supplying the check current into the circuit 4 is detected by the detecting circuit 21 to obtain the detection voltage Vd. The first discriminator 26 is responsive to the detection voltage Vd, and discriminates whether or not there is a malfunction in the current path including the transistor 10 and the electrically fired actuator 3. The result is displayed by the display device 51.

At the same time, the second discriminator 27 monitors the change in the level of the output voltage of the energy reservoir 9 caused by drawing the check current with a constant level from the energy reservoir 9 into the circuit 4 during the predetermined time period, and it is discriminated whether or not the capacity of the capacitor 8 is sufficient for actuating the electrically fired actuator 3 on the basis of the decrease in the level of the output voltage after the check current is drawn therefrom.

In this case, since a resistor 28 is connected in parallel with the safety switch 11, the check current is able to flow through the resistor 28 even if the safety switch 11 is open, as when, for example, the vehicle running speed is low, so that the monitoring or checking operations described above can be always carried out even if, for example, the vehicle is not running.

When the control signal CS is produced at the detection of the occurrence of a vehicle collision, the current regulating transistor 10 is turned ON completely regardless of the operation condition of the second control unit 13, so that firing current with a level sufficient for actuating the electrically fired actuator 3 is supplied from the energy reservoir 9 to the electrically fired actuator 3. In this case, no electric energy is consumed by the detecting resistor 12 because the firing current flows through the diode 18 into the circuit 4.

Thus, when the check current is supplied from the energy reservoir 9 to the circuit 4, it is possible to monitor both the energy reservoir 9 and the current path including the firing actuator 3 and the circuit 4 at the same time.

Figure 2:
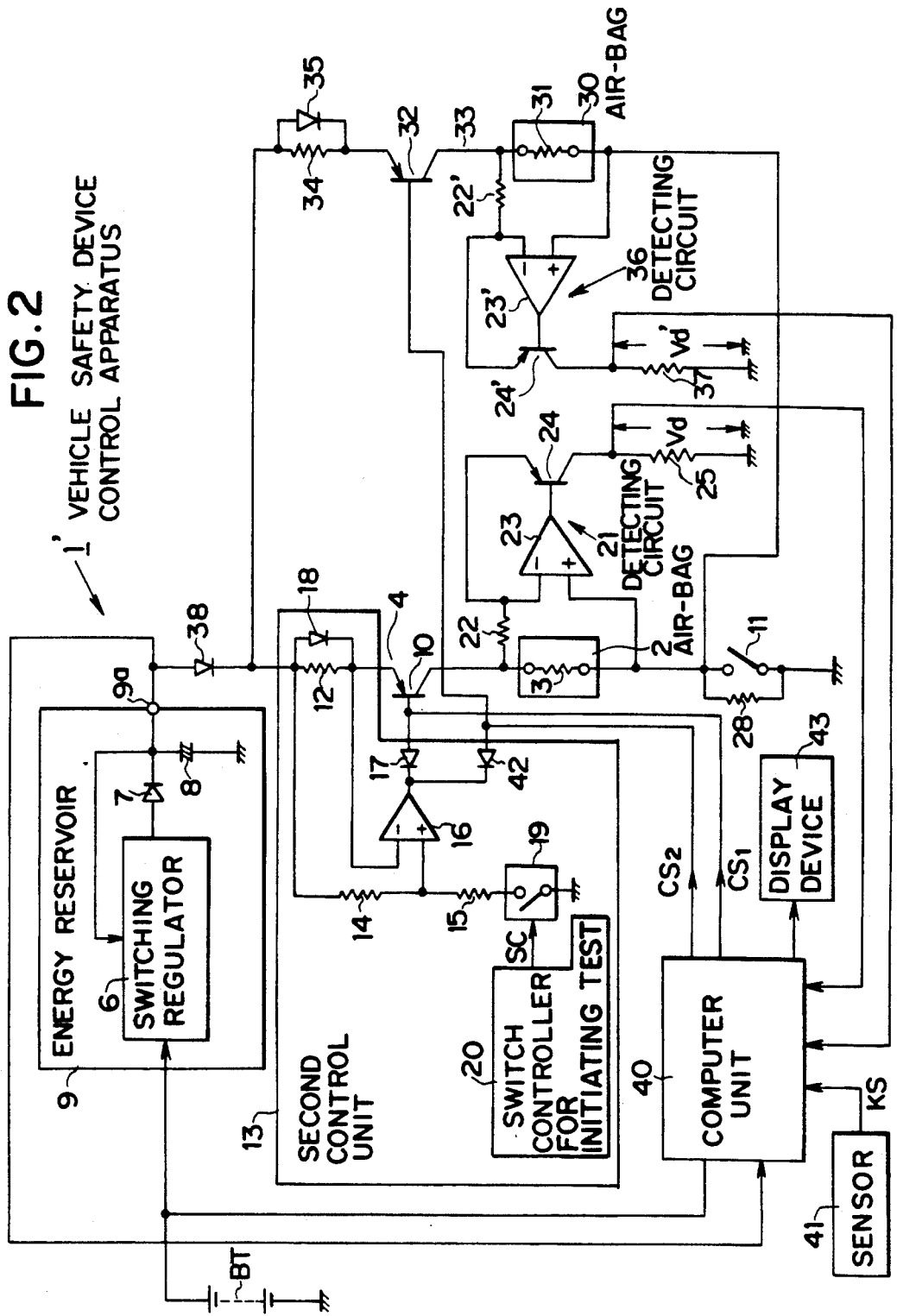
FIG. 2 is a circuit diagram showing another embodiment of a vehicle safety device control apparatus according to the present invention.

FIG. 2 is a circuit diagram showing another embodiment of a vehicle safety device control apparatus according to the present invention. A vehicle safety device control apparatus 1' shown in FIG. 2 is arranged so as to control the firing of an electrically fired actuator 31 of an air-bag 30 for a front passenger seat in addition to the air-bag 2 for the driver's seat. For this, the electrically fired actuator 31 is connected in series with another current regulating transistor 32. A circuit 33 including the transistor 32 for the air-bag 30 is connected between the electrically fired actuator 31 and the energy reservoir 9 through a diode 38. Reference numeral 34 designates a resistor corresponding to the detecting resistor 12 and a diode 35 is connected in parallel with the resistor 34. A detecting circuit 36 is provided for detecting the voltage developed across the electrically fired actuator 31 and a detection voltage Vd' is developed across a resistor 37 similarly to the case of the detecting circuit 21. Therefore, no description of the operation of the detecting circuit 36 will be given here. In FIG. 2, the portions corresponding to the portions in FIG. 1 are designated by the identical reference symbols, respectively, and no description will be given thereto.

The vehicle safety device control apparatus 1' of FIG. 2 has a computer unit 40 comprising a conventional microcomputer (not shown) and a sensor 41 for producing an acceleration signal KS indicative of the acceleration of the vehicle. The computer unit 40 is responsive to the acceleration signal KS and processes the acceleration signal KS in accordance with a predetermined control program, whereby the occurrence of vehicle collisions is detected. When a vehicle collision is detected, a first control signal $CS_1$ and a second control signal $CS_2$ are produced by the computer unit 40.

The first control signal $CS_1$ is applied to the base of the current regulating transistor 10, and the transistor 10 is turned ON completely to actuate the electrically fired actuator 3. On the other hand, the second control signal $CS_2$ is produced with a predetermined time of delay after the first control signal $CS_1$ is produced, and is applied to the base of the current regulating transistor 32 to turn ON the transistor 32 completely. As a result, the electrically fired actuator 31 is actuated after the actuation of the electrically fired actuator 3, so that the air-bag 2 is firstly inflated upon the vehicle collision and then the air-bag 30 is inflated after a predetermined delay.

To control the conductivity of the current regulating transistor 32 so as to provide a check current to the circuit 33, the base of the current regulating transistor 32 is connected through a diode 42 to the output terminal of the operational amplifier 16, so that the check current can be supplied to the circuit 35 at the same time as the supply of the check current to the circuit 4. For equalizing the levels of the two check currents, it is desirable for the characteristics of the transistors 10 and 32, and these of the diodes 17 and 42, to be identical, respectively. Consequently, these semi-conductor devices are preferably fabricated as an integrated circuit formed on a single chip.

The detection voltages Vd and Vd' are applied to the computer unit 40 to discriminate whether or not each of the circuits 4 and 33 is in an operability state. This discrimination is made the same way as in the first discriminator 26 shown in FIG. 1.

To monitor the change in the level of the output voltage of the energy reservoir 9, the output voltage of the energy reservoir 9 is applied to the computer unit 40, wherein the capacity of the capacitor 8 is checked.

As described above, the vehicle safety device control apparatus 1' shown in FIG. 2 is capable of monitoring the operability of the current paths for the firing actuators 3 and 31 and the capacity of the capacitor 8 by the supplying the check currents to the circuits 4 and 33 in a manner similar to the vehicle safety device control apparatus 1 shown in FIG. 1, in addition to being capable of actuating the two air-bags 2 and 30. The result of the monitoring is indicated by a display device 43.

I claim:

1. An apparatus for controlling a vehicle safety device with a firing element, said apparatus comprising:
   an energy reservoir for providing electric energy for actuating the firing element;
   a transistor located between said energy reservoir and the firing element;
   a first control means for controlling said transistor so as to provide energy to the firing element for actuating the firing element in response to a vehicle collision;
   a second control means for controlling the transistor so as to provide a check current to the firing element, the check current having a constant level insufficient to actuate the firing element;
   a detector for producing a detection signal indicative of a condition of the firing element in response to a voltage signal developed across the firing element by the check current;
   a first discriminating means responsive to the detection signal for discriminating whether or not there is a malfunction in the firing element or a channel for supplying a firing current to the firing element; and
   a second discriminating means for discriminating whether or not there is a malfunction in the energy reservoir in response to a change in an output voltage of the energy reservoir when the check current flows.

2. An apparatus as claimed in claim 1, wherein said second control means has a resistor connected in series with the transistor to obtain a voltage whose level corresponds to that of the check current flowing through the transistor and an amplifier responsive to the voltage for producing an output signal for controlling the conductivity of the transistor so as to maintain a magnitude of the check current at the constant level.

3. An apparatus as claimed in claim 2, wherein the transistor is controlled by said second control means in such a way that the check current flows intermittently.

4. An apparatus as claimed in claim 2, wherein said second control means further comprises a pulse generating means for generating a pulse signal, and the conductivity of the transistor is controlled for allowing the check current to flow only when the pulse signal is in one of its states.

5. An apparatus as claimed in claim 2. wherein a diode is connected to the transistor in parallel with the resistor, whereby a current for firing the firing element flows through the diode at the occurrence of a vehicle collision.

6. An apparatus as claimed in claim 1, wherein a safety switch means which is rendered conductive only when the vehicle running speed is greater than a predetermined level is inserted into a current path for the firing element and a resistor for allowing the check current to flow is connected in parallel with the safety switch means.

7. An apparatus for controlling a plurality of vehicle safety devices, said apparatus comprising:

an energy reservoir for providing electric energy for actuating a firing element of each vehicle safety device;

a plurality of transistors located between said energy reservoir and the firing elements to regulate the current flowing through the respective firing elements;

a first control means for controlling each of said transistors so as to provide energy to each of the firing elements for actuating the respective firing elements in response to a vehicle collision;

a second control means for controlling each of the transistors so as to provide check currents to each of the firing elements, each of the check currents having a constant level insufficient to actuate the corresponding firing element;

a plurality of detectors each of which is for producing a detection signal indicative of a condition of an associated firing element in response to a voltage signal developed across the associated firing element by the corresponding check current; and, a discrimination unit for discriminating in response to the respective detection signals whether or not there is a malfunction in the firing elements and for discriminating whether or not there is a malfunction in the energy reservoir in response to a change in an output voltage of the energy reservoir when the check current flows.

* * * * *